(12) United States Patent
Ikeda

(10) Patent No.: US 6,930,045 B2
(45) Date of Patent: Aug. 16, 2005

(54) CROSS REFERENCE TO RELATED APPLICATION

(75) Inventor: Masanobu Ikeda, Ebina (JP)

(73) Assignee: Fujitsu Limited, Kawasaki (JP)

(*) Notice: Subject to any disclaimer, the term of this patent is extended or adjusted under 35 U.S.C. 154(b) by 107 days.

(21) Appl. No.: 10/634,838

(22) Filed: Aug. 6, 2003

(65) Prior Publication Data
US 2004/0043593 A1 Mar. 4, 2004

(30) Foreign Application Priority Data
Aug. 30, 2002 (JP) .................................. 2002-252890

(51) Int. Cl.$^7$ .................... H01L 21/44; H01L 21/4763
(52) U.S. Cl. .................... 438/687; 438/618; 438/660; 438/675
(58) Field of Search ............................... 438/618, 660, 438/675, 687

(56) References Cited

U.S. PATENT DOCUMENTS 6,821,902 B2 * 11/2004 Inoue et al. ................. 438/704
2003/0114000 A1 * 6/2003 Noguchi ..................... 438/687
2004/0051180 A1 * 3/2004 Kado et al. ................. 257/774
2004/0200728 A1 * 10/2004 Hongo et al. .............. 205/220
2004/0241985 A1 * 12/2004 Mishima et al. ........... 438/637

FOREIGN PATENT DOCUMENTS

JP          08064514 A       3/1996
JP          09275085 A       10/1997

* cited by examiner

Primary Examiner—Alexander Ghyka
(74) Attorney, Agent, or Firm—Westerman, Hattori, Daniels, and Adrian LLP

(57) ABSTRACT

The method comprises the step of forming a diffusion preventing film 16 and an insulation film 18 on an insulation film 12 formed on a substrate 10 and having a Cu interconnection layer 14 buried in; the step of forming a contact hole 20 in the insulation film 18 down to the Cu interconnection layer 14; the step of cleaning the substrate 10 with the contact hole 20 formed with a chemical liquid; the step of drying the substrate 10 cleaned with the chemical liquid; and the step of annealing the dried substrate in a reducing atmosphere.

20 Claims, 18 Drawing Sheets

CROSS REFERENCE TO RELATED APPLICATION

CROSS-REFERENCE TO RERATED APPLICATION

This application is based upon and claims priority of Japanese Patent Application No. 2002-252890, filed on Aug. 30, 2002, the contents being incorporated herein by reference.

BACKGROUND OF THE INVENTION

The present invention relates to a method for fabricating a semiconductor device using copper as an interconnection material.

Higher integration of semiconductor cells and downsizing of chips have accelerated the micronization of the interconnection, and the multi level interconnection. In logic devices having such multi level interconnection, interconnection delay is becoming one dominant factor for signal delay of the devices.

The interconnection delay, which is becoming one factor for the signal delay of the devices has a proportional relationship with a product of an interconnection resistance with an interconnection capacitance. Accordingly, to decrease the interconnection delay it is important to decrease the interconnection resistance and the interconnection capacitance.

As a means for decreasing the interconnection resistance, the use of insulation films of low dielectric constants and the use of Cu as an interconnection material are being studied. Especially the interconnection of Cu, which has low resistibility, is easy to be formed in films, is good in stability and can much contribute to the interconnection delay decrease, is expected to much contribute to higher device performances.

In the step of forming Cu interconnection layers, for the electrical interconnection between the interconnection layers, a contact hole is formed in an insulation film between the interconnection layers by etching. FIG. 14A is a sectional view of a Cu interconnection layer after a contact hole has been formed in. The Cu interconnection layer 104 is buried in an insulation film 102 formed on a substrate 100. A diffusion preventing film 106 and an insulation film 108 are sequentially formed, and the contact hole 110 is formed in the insulation film 108 and the diffusion preventing film 106 down to the Cu interconnection layer 104.

Contaminants 112 of fluorocarbon polymers, etc. produced in the etching stay on the inside wall of the formed contact hole 110. To remove such contaminants 112, wet cleaning using a chemical liquid is usually performed.

In the drying following the wet cleaning, spin drying, which remove a liquid by a centrifugal force generated by the rotation of a substrate, is generally used. The spin drying can sufficiently dry the interior of the contact hole of an about 0.30 $\mu$m-diameter formed in the conventional Cu interconnection layer.

However, the diameter of the contact hole is more reduced as the interconnection is more micronized, and when a cleaning liquid enters the contact hole, the capillary phenomena takes place. Accordingly, as the size of the contact hole is more reduced, the spin drying finds it difficult to sufficiently dry the interior of the contact hole.

When the interior of the contact hole is not sufficiently dried, a cleaning liquid or fluorocarbon polymer remaining in the contact hole reacts with $H_2S$ and $H_2O$ in the atmosphere, and furthermore, the reaction products react with the base Cu interconnection layer. Resultantly, as shown in FIG. 14B, an oxide layer 114 of $CuF_4$, $CuO,CuO_2$, etc. is formed on the surface of the Cu interconnection layer exposed in the contact hole 110 and causes defective contact when the interconnection layers are interconnected.

In the method for fabricating a semiconductor device in which the contact hole is formed before the interconnection layer is patterned, often an alkaline chemical liquid is used for cleaning the contact hole, and a chemical amplification-type resist film 116 is used for patterning the interconnection layer. In this case, when the drying after the cleaning is insufficient, the alkaline chemical liquid remaining in the contact hole even after the drying processing acts on the chemical amplification-type resist as an acid deactivating material. Resultantly, as shown in FIG. 14C, the chemical amplification-type resist film 116 formed on the insulation film 108 has a patterning defect due to the tailing phenomena, and an undesirable condition that the patterning of high precision is difficult will take place.

To overcome defects due to such insufficient drying following the cleaning, various methods have been so far proposed.

For example, Japanese Patent Laid-Open Publication No. Hei8-64514 (1996) discloses a method for low pressure drying following the drying by spin drying. FIG. 15 is the flow chart of the semiconductor fabrication method disclosed in Japanese Patent Laid-Open Publication No. Hei8-64514 (1996). As shown, the step S100 of forming a contact hole by etching is followed sequentially by the step S102 of cleaning with a chemical liquid, the step S104 of drying by spin drying and the step S106 of low pressure drying.

Japanese Patent Laid-Open Publication No. Hei9-275085 (1997) discloses a method of drying by spin drying and low pressure drying and then dry cleaning with plasmas. FIG. 16 is the flow chart of the semiconductor fabrication method disclosed in Japanese Patent Laid-Open Publication No. Hei9-275085 (1997). As shown, the step S200 of forming a contact hole is followed sequentially by the step S202 of leaning with a chemical liquid, the step S204 of drying by spin drying and the step S206 of low pressure drying. Furthermore, the low pressure drying step S206 is followed by the step S208 of dry cleaning with plasmas.

In forming a Cu interconnection layer, a chemical liquid to be used in the cleaning after a contact hole has been formed is generally ammonium fluoride ($NH_4F$) or hydroxyamine ($NH_2OH$). When the surface of the Cu interconnection layer exposed on the bottom of the contact hole is subjected to such alkaline chemical liquid, as shown in FIG. 17, a deteriorated Cu surface layer 118 of $CuF_4$, $CuO$, $Cu_2O$ or others is formed on the surface of the Cu interconnection layer 104. The deteriorated Cu surface layer 118 causes contact resistance increase. Furthermore, the deteriorated Cu surface layer 118 is a cause for defective contact.

However, drying the substrate only by the spin drying or low pressure drying after the chemical liquid cleaning permit the $CuF_4$, $CuO$ and $Cu_2O$ produced on the surface of the Cu interconnection layer to remain as they are.

In the method disclosed in the above-described Japanese Patent Laid-Open Publication No. Hei9-275085 (1997), to remove $CuF_4$, $CuO$ and $Cu_2O$ formed by the chemical liquid on the surface of the Cu interconnection layer exposed on the bottom of the contact hole, the low pressure drying is followed by the dry cleaning with $H_2$ plasmas. The $CuF_4$, $CuO$ and $Cu_2O$ formed on the surface of the Cu interconnection layer are reduced by the plasmas, and then the contact hole is filled with a metal which interconnects the interconnection layers, whereby the occurrence of the contact defect can be suppressed.

However, when an insulation film between the interconnection layers is formed of a low dielectric constant insulation film, such as an organic film, organosilicate film or others, the dry cleaning with $H_2$ plasmas will cause the following disadvantages.

Such low dielectric constant insulation film is etched when exposed to $H_2$ plasmas, and often undesirably has configurational defects, such as bowing, etc. An organic film, for example, is etched as expressed by the following reaction formula and has configurational defects, such as bowing, etc.

$$C(s) + 4H(g) \rightarrow Si\text{—}* + CH_4(g)\uparrow$$

By being exposed to $H_2$ plasmas, the low dielectric constant insulation film often suffers surface deterioration and changes into a film which easily adsorbs degasified components. That is, as shown in FIG. 18, the insulation film 108 of a low dielectric constant insulation film has a degasified component adsorptive deteriorated film 120 formed on the surface. For example, when the low dielectric constant insulation film is organosilicate film, an adsorption site for degasified components, such as $H_2O$, etc. are formed on the surface of the insulation film 108 as expressed by the following reaction formula.

$$Si\text{—}CH_3(s) + H(g) \rightarrow Si\text{—}* + CH_4(g)\uparrow$$

To the thus-formed adsorption site for the degasified components, such as $H_2O$, etc., the degasified components, such as $H_2O$, etc. adsorbs as expressed by the following formula.

$$Si\text{—}* + H_2O \rightarrow Si\text{—}OH_2$$

As described above, when a contact hole is formed in the low dielectric constant insulation film, the dry cleaning using $H_2$ plasmas causes configurational defect and surface deterioration of the low dielectric constant insulation film. Thus, it is considered difficult to provide multi-interconnection layer structures of high stability and reliability.

SUMMARY OF THE INVENTION

An object of the present invention is to provide a method for fabricating a semiconductor device which can form an interconnection structure of high stability and reliability even in a case that micronizsed contact holes are used in the Cu interconnection layer.

According to one aspect of the present invention, there is provided a method for fabricating a semiconductor device comprising the steps of: forming a second insulation film on a first insulation film formed above a substrate and having a copper interconnection layer buried in; forming a contact hole in the second insulation film down to the copper interconnection layer; cleaning the substrate with the contact hole formed with a chemical liquid; drying the substrate cleaned with the chemical liquid; and annealing the dried substrate in a reducing atmosphere.

As described above, according to the present invention, a second insulation film is formed on a first insulation film formed on a substrate and having a copper interconnection layer buried in, a contact hole is formed in the second insulation film down to the copper interconnection layer, the substrate with the contact hole formed is cleaned with a chemical liquid, the substrate cleaned with the chemical liquid is dried, and the dried substrate is annealed in a reducing atmosphere, whereby an interconnection structure of high stability and reliability can be formed even in a case that micronizsed contact holes are used in the copper interconnection layer.

DETAILED DESCRIPTION OF THE INVENTION

[The Principle of the Present Invention]

Figure 1:
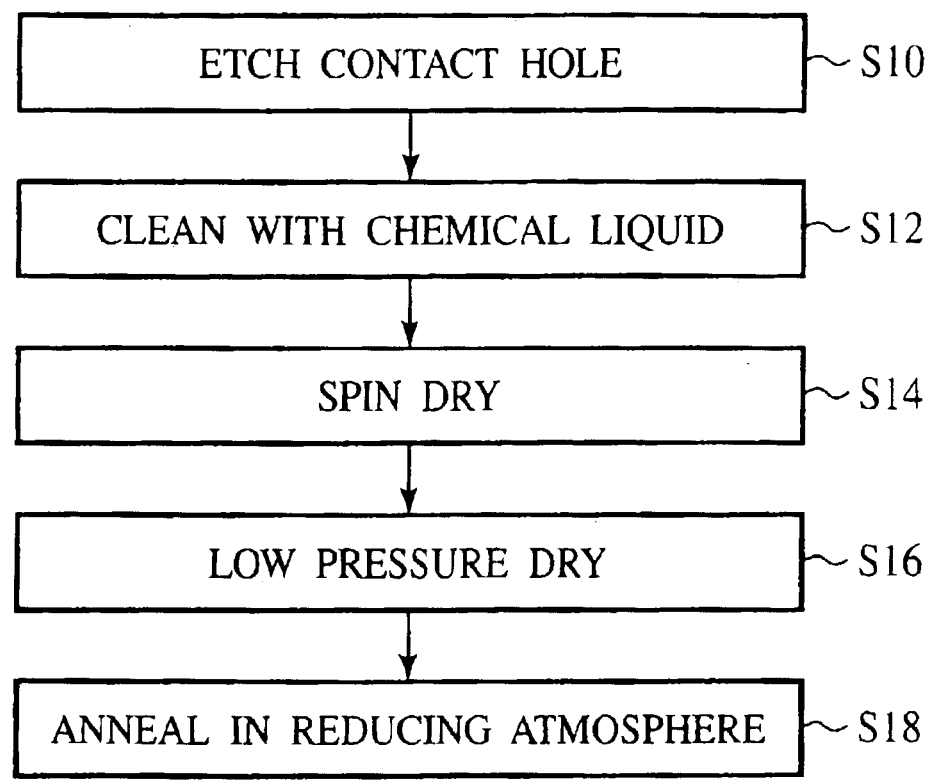
FIG. 1 is a flow chart of the method for fabricating a semiconductor device according to the present invention.
Figure 2A:
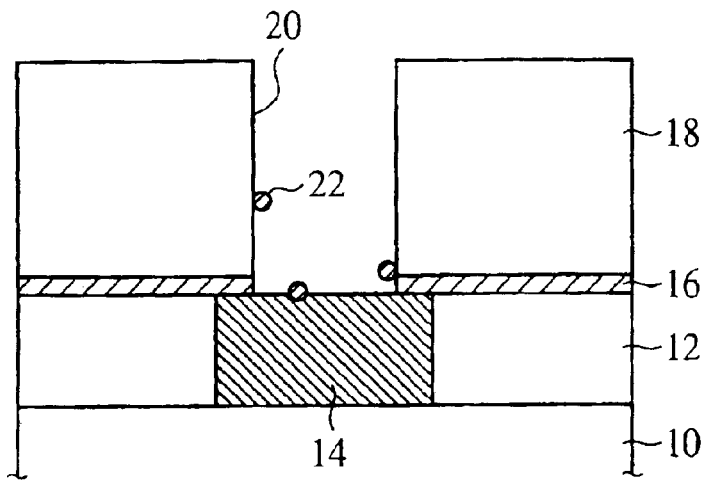
FIGS. 2A–2C are views explaining the principle of the method for fabricating a semiconductor device according to the present invention.
Figure 2B:
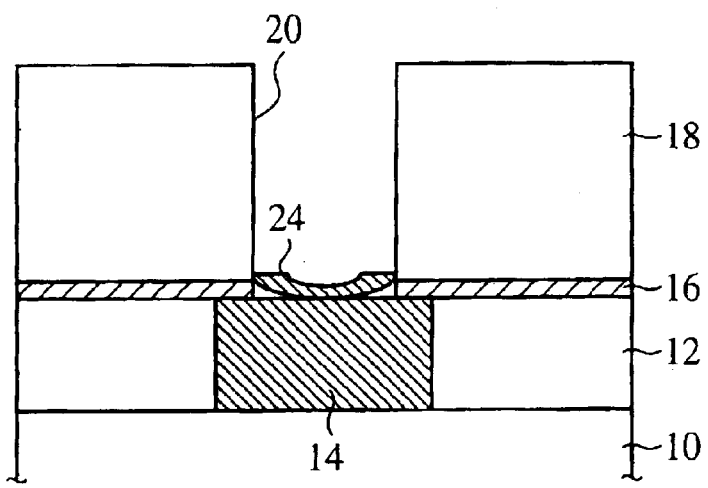
Figure 2C:
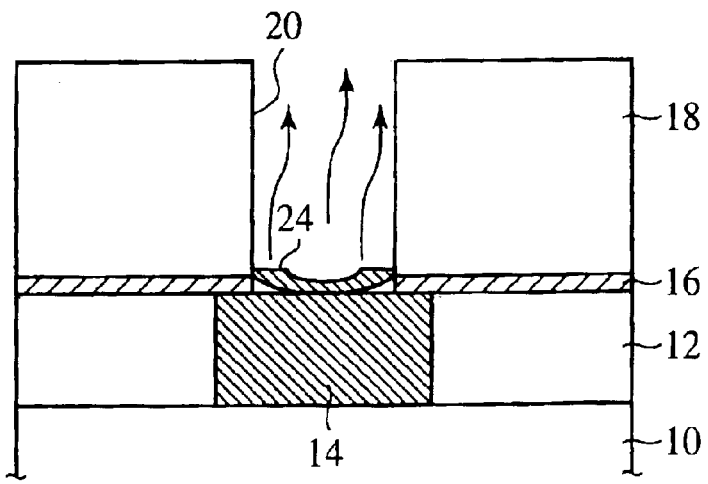
Figure 3:
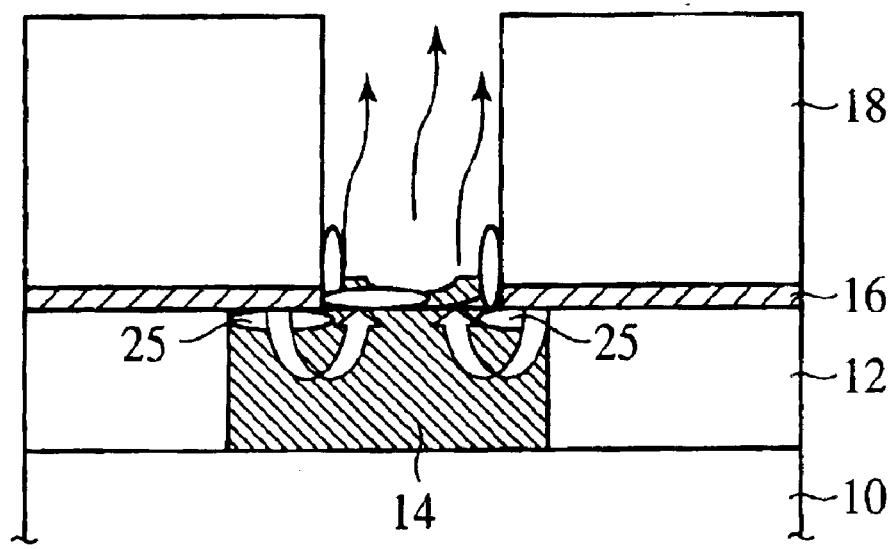
FIG. 3 is a sectional view showing voids formed by Cu migration in annealing.

First, the principle of the method for fabricating a semiconductor device according to the present invention will be explained with reference to FIGS. 1, 2A–2C and 3. FIG. 1 is the flow chart of the method for fabricating a semiconductor device. FIGS. 2A–2C are sectional views of the semiconductor device in the steps of the method for fabricating the semiconductor device according to the present invention, which explain the principle. FIG. 3 is a sectional view of the semiconductor device, which shows a void formed by the migration of Cu in annealing.

In the method for fabricating a semiconductor device according to the present invention, in the step of forming a Cu interconnection layer, as shown in FIG. 1, the step S10 of forming a contact hole in an insulation film down to the Cu interconnection layer by etching, the step S12 of cleaning with a chemical liquid, the step S14 of drying the contact hole by spin drying, the step S16 of low pressure drying, and the step S18 of annealing in a reducing atmosphere are sequentially performed.

The method for fabricating a semiconductor device according to the present invention is characterized mainly in that a substrate with a contact hole formed and cleaned with a chemical liquid, such as $NH_4F$, $NH_2OH$ or others is dried by spin drying and low pressure drying, and then annealed in a reducing atmosphere containing $H_2$ gas, $NH_3$ gas or others.

The annealing in a reducing atmosphere following the drying by spin drying and the low pressure drying can not only sufficiently dry a chemical liquid used in the cleaning, but also reduce $CuF_4$, $CuO$ and $Cu_2O$ formed on the surface of the Cu interconnection layer exposed on the bottom of the contact hole to reproduce the Cu. Thus, the generation of defective contact can be suppressed, and an interconnection structure of high stability and high reliability can be formed.

Furthermore, Being different from the dry cleaning by $H_2$ plasma, the annealing in a reducing atmosphere can reduce and remove the $CuF_4$, $CuO$ and $Cu_2O$ without affecting the low dielectric constant film with the contact hole formed in, i.e., without causing configurational defect, such as bowing, etc., and deteriorating the surface.

FIG. 2A is a sectional view of the contact hole formed down to the Cu interconnection layer by etching. As shown, the Cu interconnection layer 14 is buried in an insulation film 12 formed on a substrate 10. A diffusion preventing film 16 and an insulation film 18 are sequentially formed on the insulation film 12 with the Cu interconnection layer 14 buried in. The contact hole 20 is formed in the insulation film 18 and the diffusion preventing film 16 down to the Cu interconnection layer 14. Contaminants 22, such as residual resist film, etc. stay in the etched contact hole 20.

To remove such contaminants, wet cleaning with a chemical liquid, such as $NH_4F$, $NH_2OH$ or others, is performed. FIG. 2B is a sectional view showing the contact hole cleaned with the chemical liquid. As shown, the contaminants 22 are removed by the wet cleaning with the chemical liquid, but a deteriorated Cu surface layer 24 of $CuF_4$, $CuO$, $Cu_2O$, etc.

is formed on the surface of the Cu interconnection layer 14 exposed on the bottom of the contact hole 20 by the reaction with the chemical liquid, such as $NH_4F$, $NH_2OH$ or others.

As shown in FIG. 2C, the deteriorated Cu surface layer 24 formed on the surface of the Cu interconnection layer 14 is reduced as expressed by the following reaction formulae by the annealing in a reducing atmosphere containing a reducing gas, such as $H_2$, $NH_3$ or others, and the Cu on the surface of the Cu interconnection layer 14 is regenerated.

The $CuF_4$ reacts with $H_2$ or $NH_3$ as follows:

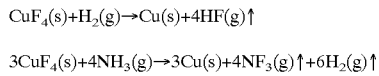

The CuO reacts with $H_2$ or $NH_3$ as follows:

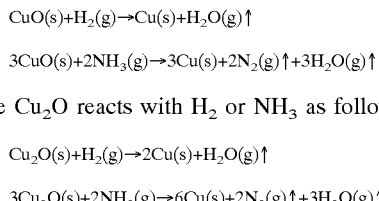

The $Cu_2O$ reacts with $H_2$ or $NH_3$ as follows:

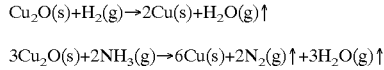

As the reducing atmosphere for the annealing, $H_2$ gas or $NH_3$ gas can be singly used, but, for example, a mixed gas of $H_2$ and $N_2$, a mixed gas of $H_2$ and a rare gas, such as He, Ar, Kr, Xe or others, a mixed gas of $H_2$ and $NH_3$, a mixed gas of $NH_3$ and $N_2$, a mixed gas of $NH_3$ and a rare gas, such as He, Ar, Kr, Xe or others, or others can be also used.

It is preferable that an oxygen concentration of the reducing atmosphere for the annealing is controlled to be equal to or less than 100 ppm.

The annealing in the reducing atmosphere of an above 100 ppm oxygen concentration oxidizes the Cu of the exposed surface of the Cu interconnection layer. The oxidation of Cu tends to take place at grain boundaries, and the oxidation phenomena at the grain boundaries acts as a diffusion path for atom transfer in the reliability test for the interconnection. Thus, the oxidation of the Cu used as an interconnection material causes much reliability drop of the interconnection layer. Accordingly, it is preferable to control an oxygen concentration of the reducing atmosphere for the annealing to be equal to or less than 100 ppm.

It is preferable that the annealing temperature in the reducing atmosphere is equal to or more than 320° C. and equal to or less than 420° C.

The following TABLE 1 shows the durability of the interconnection depending on the absence and presence of the voids, and contact resistances, which were measured in a reducing atmosphere with the annealing temperature varied. As for the interconnection durability depending on the absence and presence of the voids, temperatures at which the interconnection durability is equal to or longer than that at a 400° C. annealing temperature as a reference are indicated by ○, temperatures at which the interconnection durability is above 0.6 times and below 0.8 times are indicated by Δ, and temperatures at which the interconnection durability is below 0.6 times exclusive of 0.6 times are indicated by ×. As for the contact resistance, temperatures at which the contact resistance is below that similarly at a 400° C. annealing temperature as a reference are indicated by ○, temperatures at which the contact resistance is above once and below 1.2 times are indicated by Δ, and temperatures at which the contact resistance exceeds 1.2 times that at the reference temperature are indicated by ×.

TABLE 1

| Annealing Temperature | Presence of Void in Lower Interconnection layer | Contact Resistance Increase |
|---|---|---|
| 300° C. | ○ | X |
| 320° C. | ○ | Δ |
| 350° C. | ○ | ○ |
| 380° C. | ○ | ○ |
| 400° C. | ○(Reference) | ○(Reference) |
| 420° C. | Δ | Δ |
| 450° C. | X | X |

As evident in TABLE 1, the annealing at a temperature above 420° C. lowers the interconnection durability. This is because the annealing at a temperature above 420° C. causes, as shown in FIG. 3, the migration of the Cu due to heat in the interface between the diffusion preventing film 16 and the Cu interconnection layer 14, moving the Cu from the interconnection layer to the via, and resultantly voids 25 are formed in the Cu interconnection layer 14. Thus, it is preferable that, as described above, the annealing temperature is equal to or less than 420° C.

On the other hand, the annealing at a temperature below 320° C. has increased the contact resistance. This is because that the annealing at a temperature below 320° C. cannot sufficiently remove the deteriorated Cu surface layer of, $CuF_4$, CuO, $Cu_2O$ or others. Thus, it is preferable that, as described above, the annealing temperature is equal to or more than 320° C.

In the method for fabricating a semiconductor device according to the present invention, the annealing in a reducing atmosphere can remove fluorides and oxides of Cu, such as $CuF_4$, CuO, $Cu_2O$, etc. formed on the surface of the Cu interconnection by the reaction of the Cu with chemical liquids, whereby the contact resistance increase and the generation of defective contact between the interconnection layers can be suppressed, and the Cu interconnection of high stability and reliability can be formed.

[An Embodiment]

Figure 4:
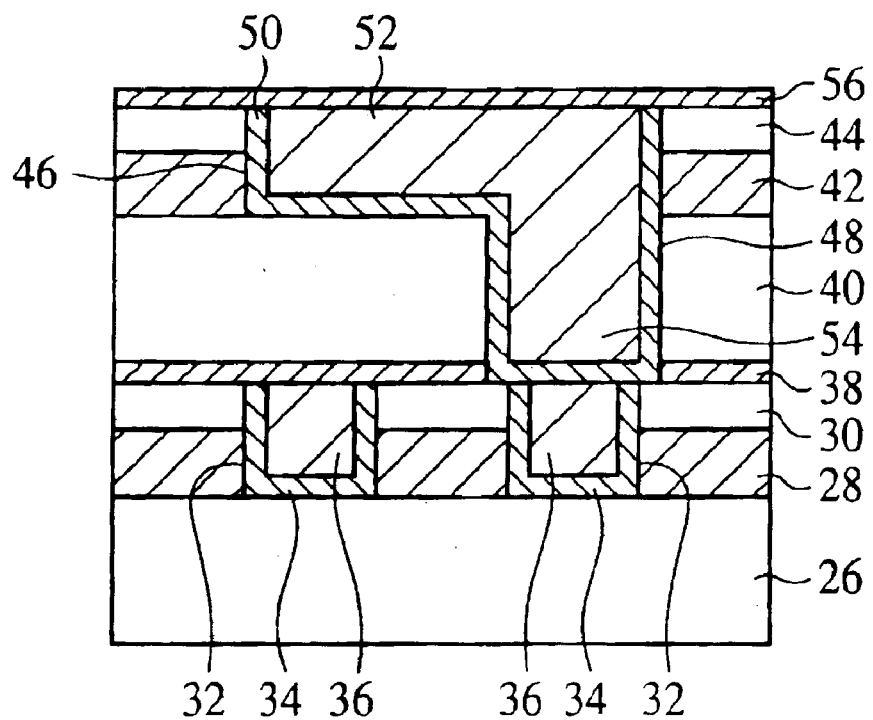
FIG. 4 is a sectional view of a Cu interconnection structure formed by the method for fabricating a semiconductor device according to one embodiment of the present invention.

Next, the method for fabricating a semiconductor device according to an embodiment of the present invention will be explained with reference to FIGS. 4, 5A–5C, 6A–6C, 7A–7C, 8A–8C, 9A–9B, 10A–10B, 11A–11C, 12A–12B, and 13A–13B. FIG. 4 is a sectional view of the Cu interconnection formed by the method for fabricating a semiconductor device according to the present embodiment, which shows a structure of the Cu interconnection. FIGS. 5A–5C, 6A–6C, 7A–7C, 8A–8C, 9A–9B, 10–10B, 11A–11C, 12A–12B, and 13A–13B are sectional views of the Cu interconnection structure in the steps of the semiconductor fabrication method according to the present embodiment.

In the method for fabricating a semiconductor device according to the present embodiment, the multi-interconnection layer structure shown in FIG. 4 including a first Cu interconnection layer and a second Cu interconnection layer which is connected to the first Cu interconnection layer through a via, is formed.

As shown, an organic low dielectric constant film 28 and a silicon oxide film 30 are sequentially formed on a silicon substrate 26. First interconnection grooves 32 are formed in the organic low dielectric constant film 28 and the silicon oxide film 30. A first Cu interconnection layer 36 of a Cu film is buried in the first interconnection grooves 32 with a tantalum film 34 as a barrier metal therebetween.

On the silicon oxide film with the first Cu interconnection layer 36 buried in, a diffusion preventing film 38 of a silicon nitride film, a silicon oxide film 40, an organic low dielectric constant film 42 and a silicon oxide film 44 are sequentially formed.

A second interconnection groove 46 is formed in the silicon oxide film 44 and the organic low dielectric constant film 42. A contact hole 48 is formed in the silicon oxide film 40 and the diffusion preventing film 38 down to the first Cu interconnection layer 36 and in connection with the second interconnection groove 46.

In the second interconnection groove 46, a second Cu interconnection layer 52 of a Cu film is buried with a tantalum film 50 as a barrier metal formed therebetween. In the contact hole 48, the via portion of a second interconnection layer 52 of a Cu film is buried.

A diffusion preventing film 56 of a silicon nitride film is formed on the silicon oxide film 44 with the second Cu interconnection layer 52 buried in.

Next, the method for fabricating the semiconductor device according to the present embodiment will be explained with reference to FIGS. 5A–5C, 6A–6C, 7A–7C, 8A–8C, 9A–9B, 10A–10B, 11A–11C, 12A–12B, and 13A–13B.

First, the organic low dielectric constant film 28 of a 150 nm-thickness is formed on the silicon substrate 26 by, e.g., spin coating. The organic low dielectric constant film 28 may be a low dielectric constant film, e.g., an organic film of allylether group, fluorocarbon group, hydrogen silsesquioxane group, hydromethylsilsesquioxane group, porous oxane group or porous allylether group, or organosilicate film, or others.

Then, the silicon oxide film 30 of a 250 nm-thickness is formed on the organic low dielectric constant film 28 by, e.g., plasma CVD (Chemical Vapor Deposition). In place of the silicon oxide film 30, a silicon oxynitride film, a silicon nitride film or others may be formed by plasma CVD.

Figure 5A:
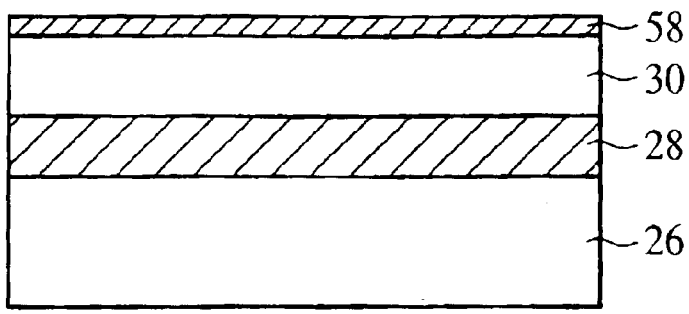
FIGS. 5A–5C are sectional views of the semiconductor device in the steps of the semiconductor fabricating method according to the embodiment of the present invention (Part 1).

Then, a 60 nm-thickness reflection preventing film 58 is formed on the silicon oxide film 30 (FIG. 5A).

Figure 5B:
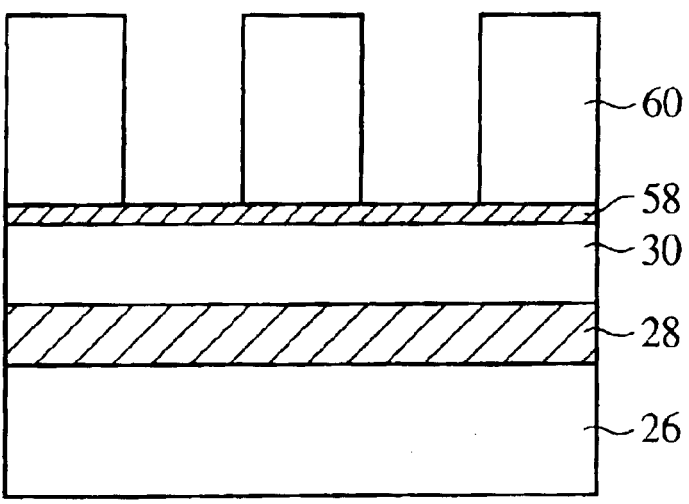

Then, a resist film 60 is formed on the reflection preventing film 58. Next, the resist film 60 is patterned into a shape which exposes a region for a pattern of the first interconnection layer to be formed in (FIG. 5B).

Figure 5C:
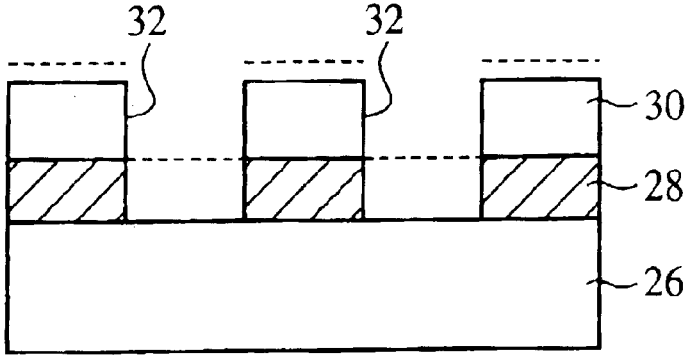

Then, with the patterned resist film 60 as a mask, the reflection preventing film 58, the silicon oxide film 30 and the organic low dielectric constant film 28 are sequentially etched by, e.g., RIE (Reactive Ion Etching). The first interconnection groove 32 having the first interconnection layer pattern is thus formed. After the first interconnection groove 32 has been formed, the resist film 60 and the reflection preventing film 58 are removed (FIG. 5C).

Then, the silicon substrate 26 with the first interconnection grooves 32 form is wet cleaned with a chemical liquid, such as $NH_4$, $NH_2OH$ or others.

After the cleaning with the chemical liquid has been completed, the drying is performed by spin drying.

Next, low pressure drying is performed in a nitrogen gas atmosphere of, e.g., a 100 ppm oxygen concentration and under a 10 Torr pressure.

Figure 6A:
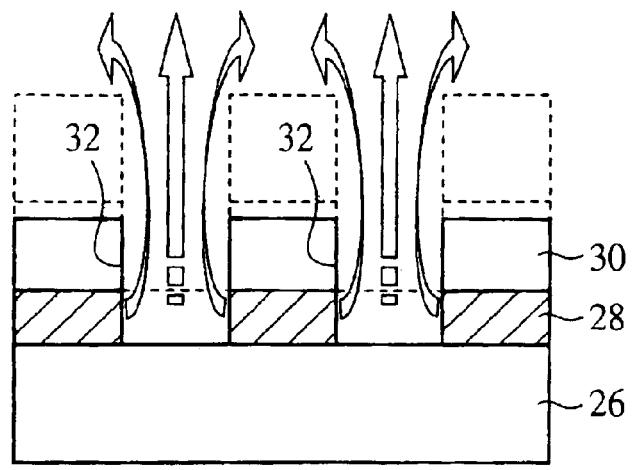
FIGS. 6A–6C are sectional views of the semiconductor device in the steps of the semiconductor fabricating method according to the embodiment of the present invention (Part 2).

Then, the annealing is performed in an $NH_3$ gas reducing atmosphere (FIG. 6A). Conditions for the annealing are, e.g., 400° C., a 4 Torr pressure, a 2000 sccm $NH_3$ gas flow rate and 5 minutes of annealing. This annealing can remove degasified components produced by damages caused on the side walls in the etching.

Thus, the processing series following the cleaning with a chemical liquid can sufficiently dry the first interconnection groove 32 including the inside of the first interconnection groove 32 and sufficiently remove contaminants inside the first interconnection groove 32.

Figure 6B:
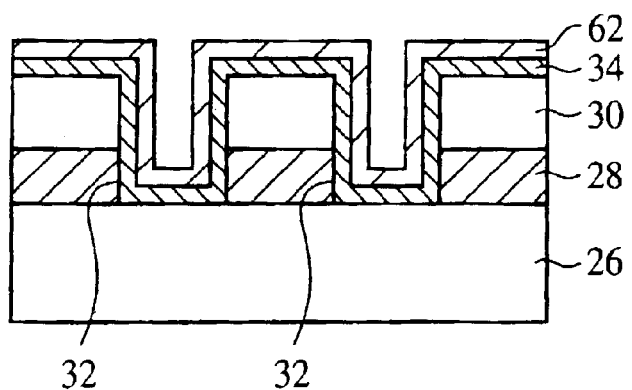

Next, the tantalum film 34 as a barrier metal of a 15 nm-thickness and a 130 nm-thickness seed Cu film 62 are sequentially formed on the entire surface by, e.g., sputtering (FIG. 6B).

Figure 6C:
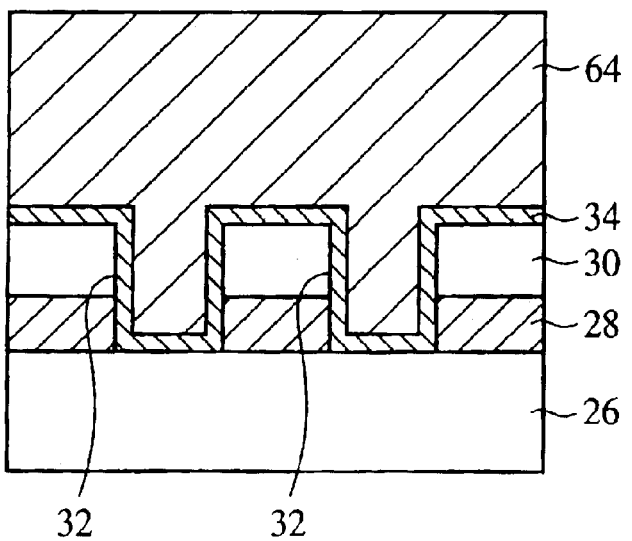

Next, a 970 nm-thickness Cu film 64 is formed on the seed Cu film 62 by electrolytic plating (FIG. 6C).

Figure 7A:
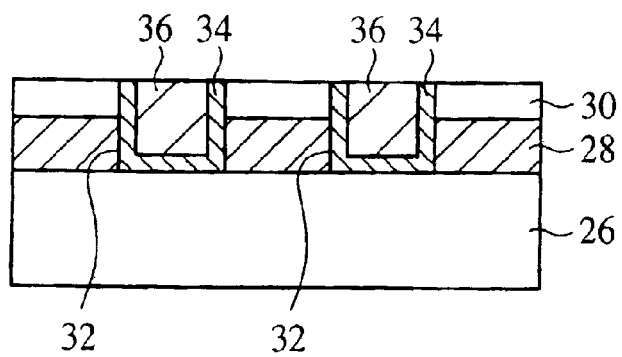
FIGS. 7A–7C are sectional views of the semiconductor device in the steps of the semiconductor fabricating method according to the embodiment of the present invention (Part 3).

Then, the upper parts of the Cu film 64, the seed Cu film 62, the tantalum film 34, and the silicon oxide film 30 in the region except the first interconnection groove 32 are removed by CMP (Chemical Mechanical Polishing). Thus, the first Cu interconnection layer 36 of Cu film 64 buried in the first interconnection groove 32 is formed (FIG. 7A).

Figure 7B:
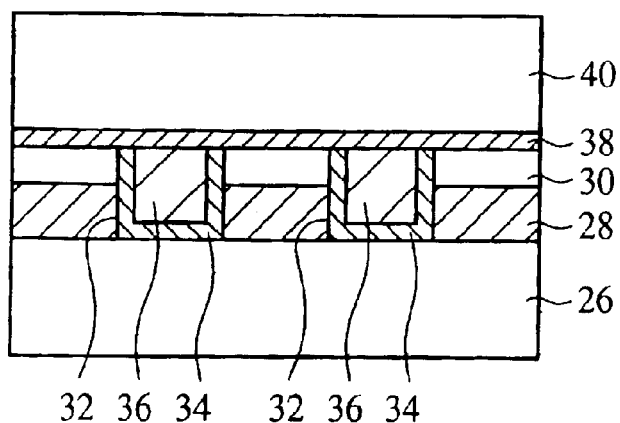

Next, the diffusion preventing film 38 of a 70 nm-thickness silicon nitride film and a 280 nm-thickness silicon oxide film 40 are sequentially formed on the entire surface by, e.g., plasma CVD (FIG. 7B).

Then, an organic low dielectric constant film 42 of a 150 nm-thickness is formed on the silicon oxide film 40 by, e.g., spin coating. As is the organic low dielectric constant film 28, the organic low dielectric constant film 42 can be a low dielectric constant film of, e.g., allylether group, fluorocarbon group, hydrogen silsesquioxane group, hydromethylsilsesquioxane group, porous oxane group or porous allylether group, or others.

Next, a 25 nm-thickness silicon oxide film 44 is formed on the organic low dielectric constant film 42 by, e.g., plasma CVD. In place of the silicon oxide film 44, a silicon oxynitride film, a silicon nitride film, etc. may be formed by plasma CVD.

Figure 7C:
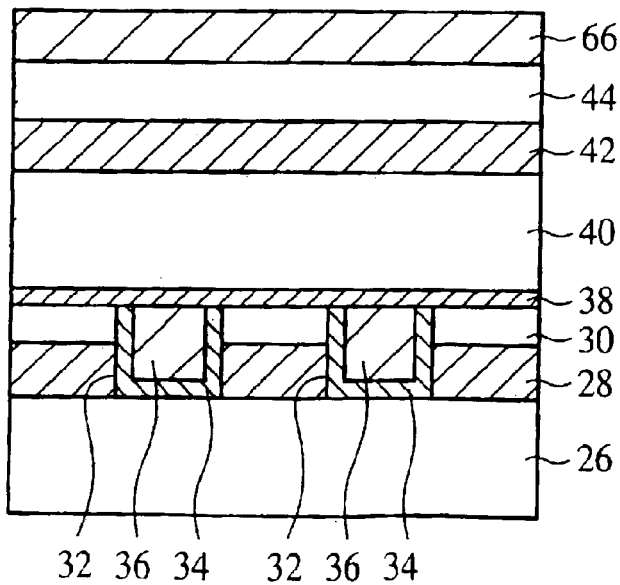

Then, a 100 nm-thickness silicon nitride film 66 to be used as an etching mask in a later step is formed on the silicon oxide film 44 by, e.g., plasma CVD (FIG. 7C).

Next, the reflection preventing film 68 of a 60 nm-thickness is formed on the silicon nitride film 66.

Figure 8A:
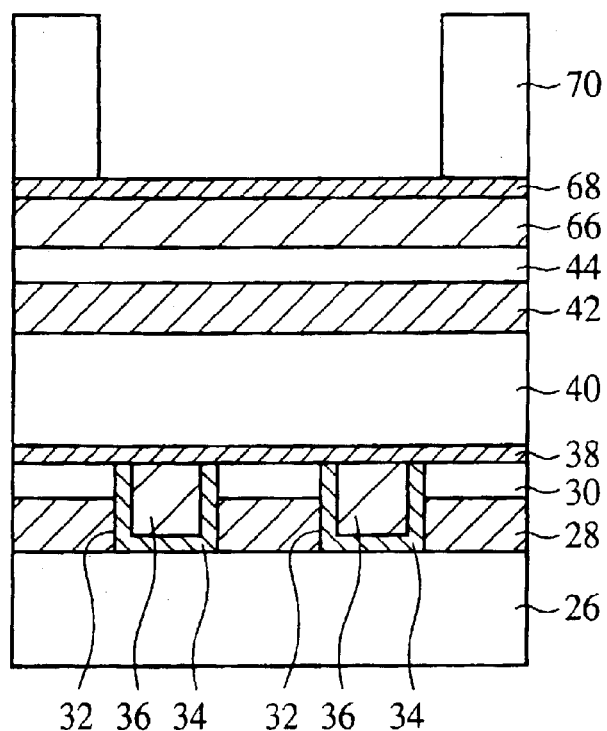
FIGS. 8A–8B are sectional views of the semiconductor device in the steps of the semiconductor fabricating method according to the embodiment of the present invention (Part 4).

Then, a resist film 70 is formed on the reflection preventing film 68. Next, the resist film 70 is patterned into a shape for exposing a region for the second interconnection pattern to be formed in (FIG. 8A).

Figure 8B:
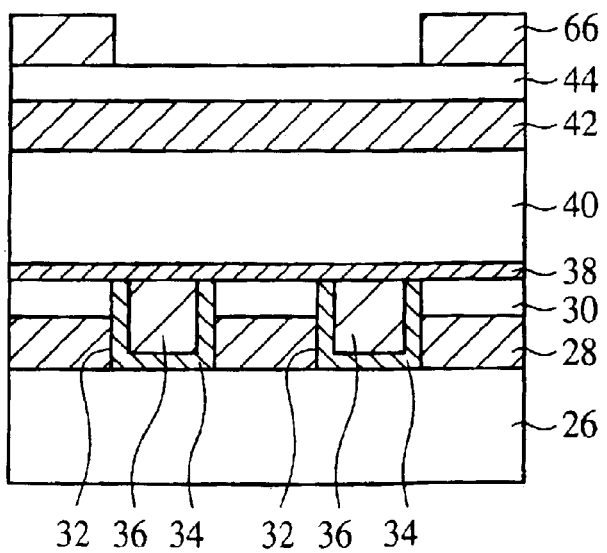

Next, with the patterned resist film 70 as a mask, the reflection preventing film 68 and the silicon nitride film 66 are sequentially etched by, e.g., RIE. Thus, the silicon nitride film 66 is patterned into a shape for exposing the region for the second interconnection pattern to be formed in. After the silicon nitride film 66 has been patterned, the resist film 70 and the reflection preventing film 68 are removed (FIG. 8B).

Then, a 140 nm-thickness reflection preventing film 72 is formed on the entire surface.

Figure 9A:
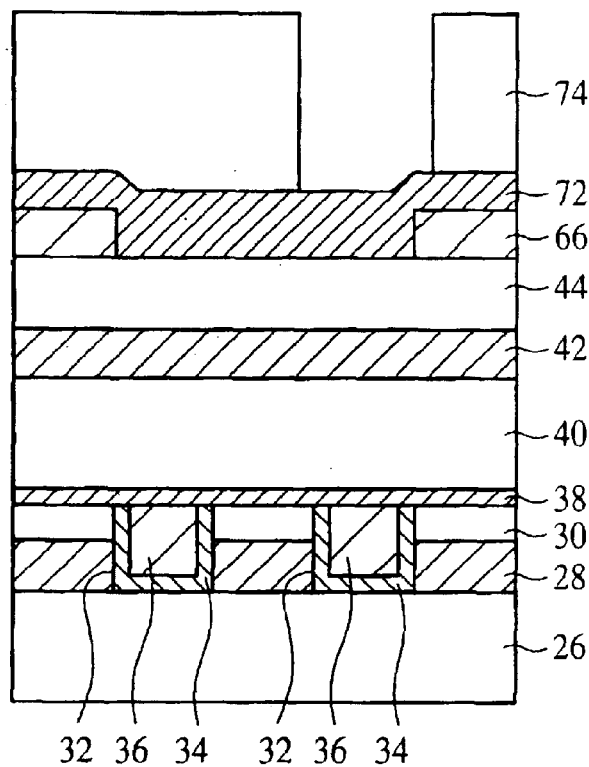
FIGS. 9A–9B are sectional views of the semiconductor device in the steps of the semiconductor fabricating method according to the embodiment of the present invention (Part 5).

Then, a resist film 74 is formed on the reflection preventing film 72. The resist film 74 is patterned by photolithography into a shape for exposing a region for the via hole 48 interconnecting to the first Cu interconnection layer 36 and the second Cu interconnection layer 52 to be formed in (FIG. 9A).

Figure 9B:
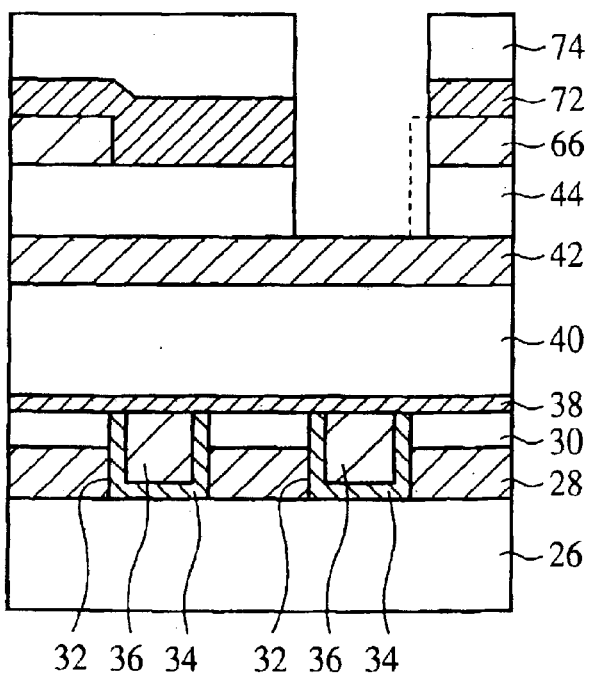

Then, with the patterned resist film 74 as a mask, the reflection preventing film 72, the silicon nitride film 66 and the silicon oxide film 44 are sequentially etched by, e.g., RIE (FIG. 9B).

Figure 10A:
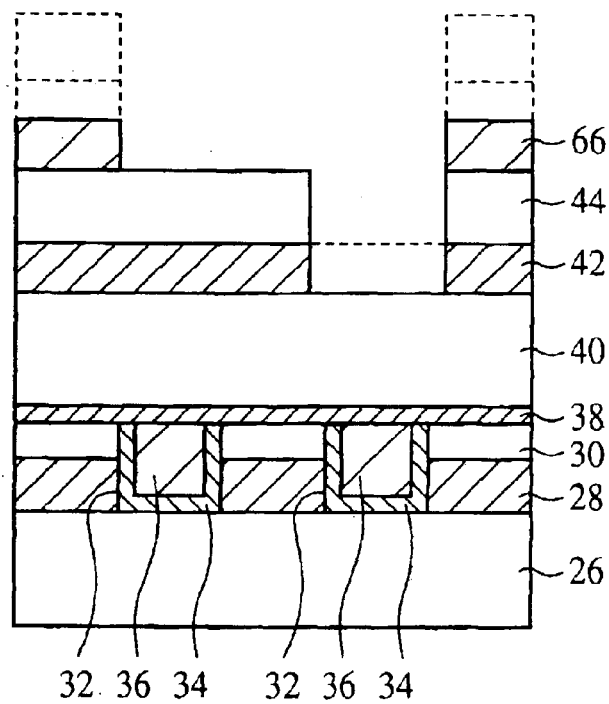
FIGS. 10A–10B are sectional views of the semiconductor device in the steps of the semiconductor fabricating method according to the embodiment of the present invention (Part 6).

Next, the organic low dielectric film 42 exposed by removing the silicon oxide film 44 is etched. The etching of the silicon nitride film 42 removes the resist film 74 and the reflection preventing film 72 (FIG. 10A).

Figure 10B:
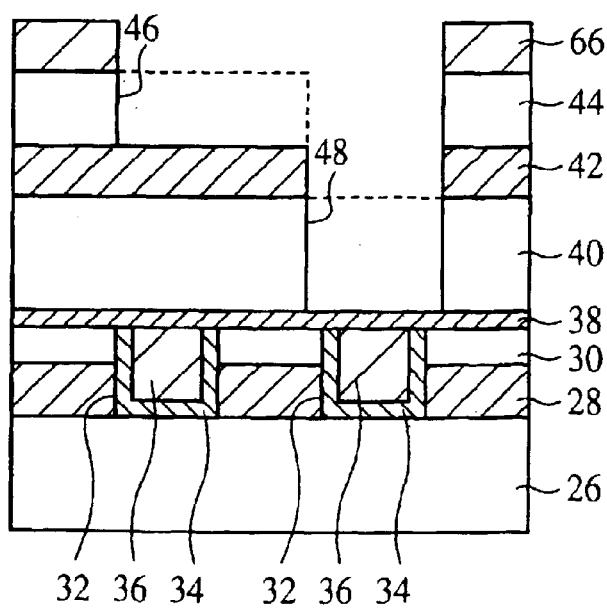

Then, with the silicon nitride film 66 as a mask, the silicon oxide film 44, and the silicon oxide film 40 exposed in the region where the organic low dielectric constant film 42 has been removed are etched. Thus, the second interconnection groove 46 having the second interconnection pattern is formed in the silicon oxide film 44 while the via hole 48 is formed down to the silicon oxide film 40 (FIG. 10B).

Figure 11A:
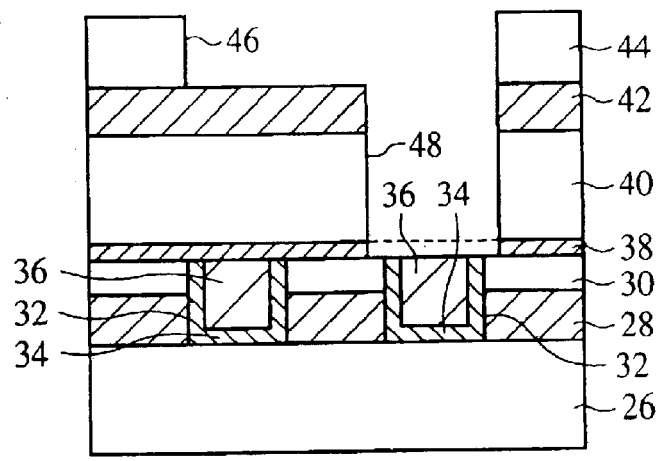
FIGS. 11A–11C are sectional views of the semiconductor device in the steps of the semiconductor fabricating method according to the embodiment of the present invention (Part 7).

Next, the silicon nitride film 66, which has been used as the mask, and the diffusion preventing film 38 of the silicon nitride film exposed on the bottom of the via hole 48 are concurrently removed by, e.g., plasma etching (FIG. 11A).

Figure 11B:
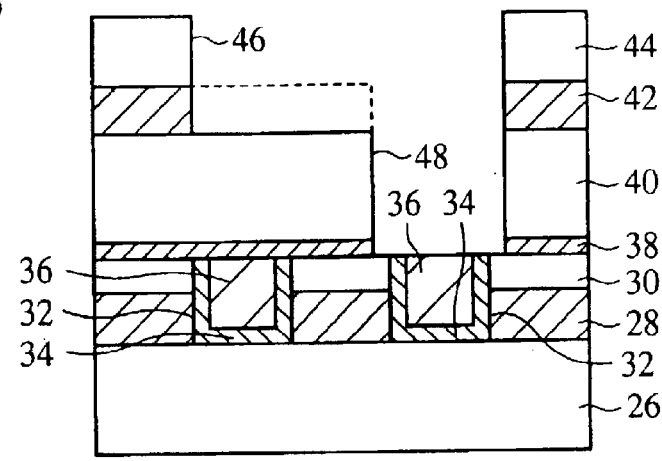

Then, with the silicon oxide film 44 with the second interconnection groove 46 formed in as a mask, the organic low dielectric constant film 42 exposed on the bottom of the second interconnection groove 46 is etched. Thus, the second interconnection groove 46 is formed down to the organic low dielectric constant film 42 (FIG. 11B).

Then, the silicon substrate 26 with the second interconnection groove 46 and the via hole 48 formed is wet cleaned with a chemical liquid, such as $NH_4F$, $NH_2OH$ or others.

After the cleaning with a chemical liquid, drying is performed first by spin drying.

Then, low pressure drying is performed in an nitrogen gas atmosphere of, e.g., a 100 ppm oxygen concentration and under a 10 Torr pressure.

Figure 11C:
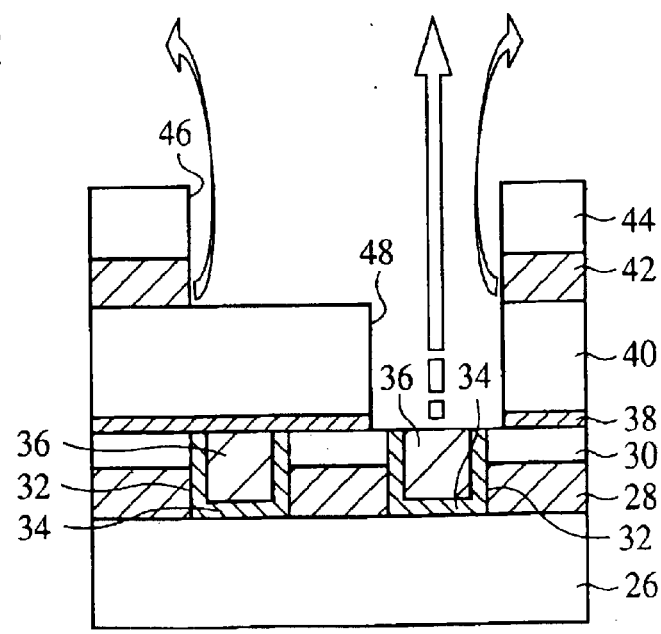

Next, annealing is performed in a $NH_3$ reducing atmosphere (FIG. 11C). Conditions for the annealing are 400° C., a 4 Torr pressure, a 2000 sccm $NH_3$ gas flow rate and 5 minutes of annealing.

Thus, the processing series following the cleaning with a chemical liquid can sufficiently dry the second interconnection groove 32 and the via hole 48 including the insides thereof and sufficiently remove contaminants in the first interconnection groove 32 and the via hole 48. The deteriorated Cu surface layer, as of $CuF_4$, $CuO$, $Cu_2O$ or others formed on the surface of the Cu interconnection layer 36 exposed on the bottom of the via hole 48 by the reaction with a chemical liquid, such as $NH_4F$, $NH_2OH$ or others, can be removed.

Figure 12A:
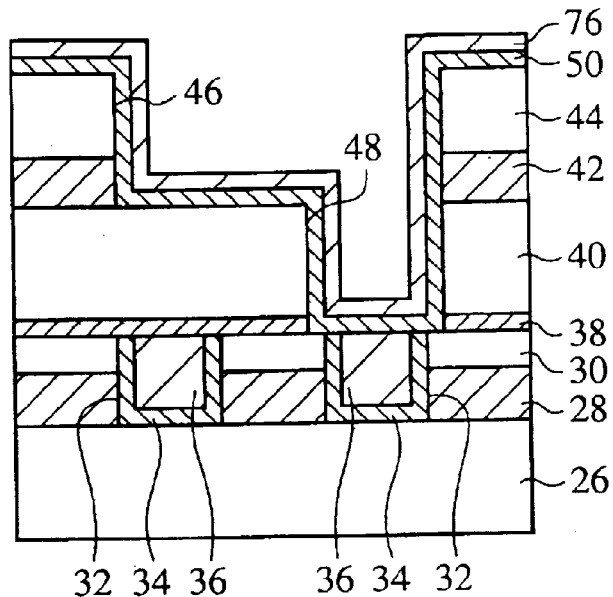
FIGS. 12A–12B are sectional views of the semiconductor device in the steps of the semiconductor fabricating method according to the embodiment of the present invention (Part 8).

Then, a tantalum film 50 of a 15 nm-thickness as a barrier metal, and a 130 nm-thickness seed Cu film 76 are sequentially formed on the entire surface by, e.g., sputtering (FIG. 12A).

Figure 12B:
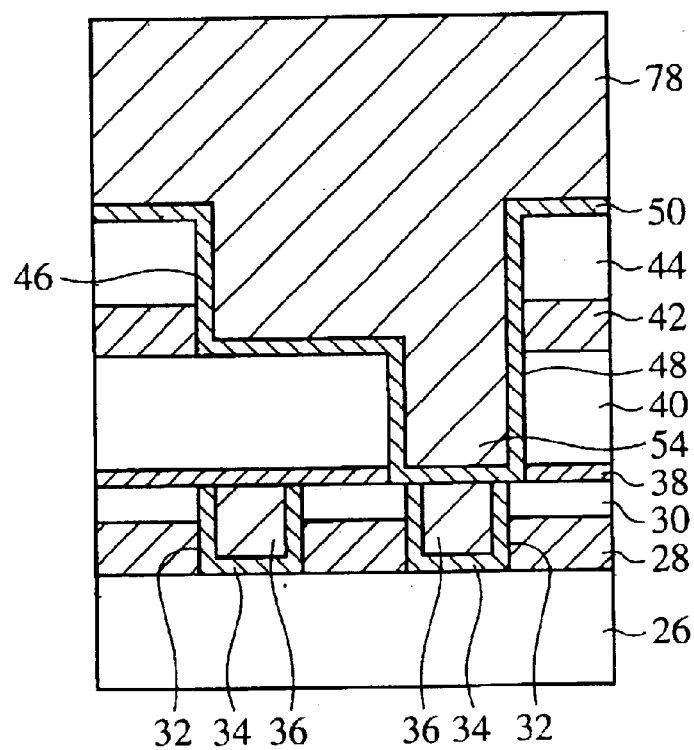

Next, a 970 nm-thickness Cu film 78 is formed on the seed Cu film 76 by electrolytic plating (FIG. 12B).

Figure 13A:
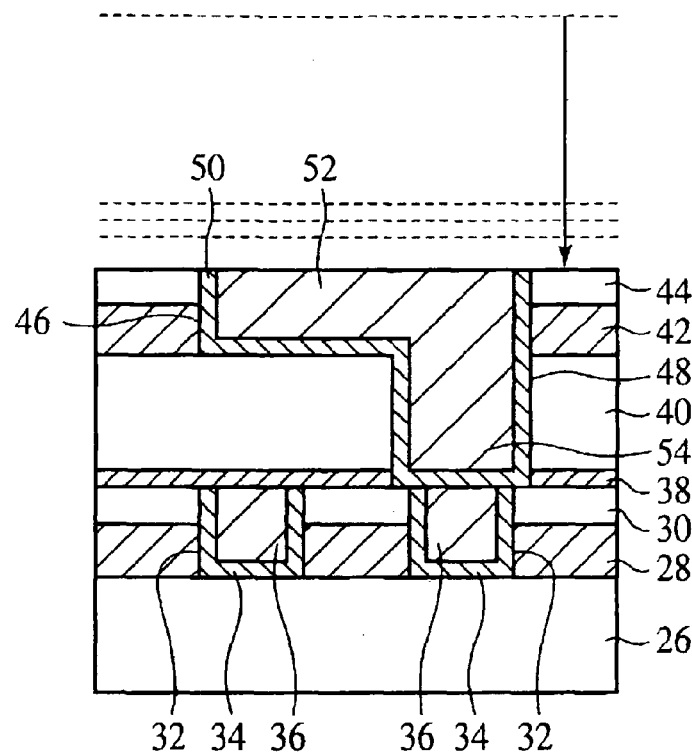
FIGS. 13A–13B are sectional views of the semiconductor device in the steps of the semiconductor fabricating method according to the embodiment of the present invention (Part 9).

Then, the upper parts of the Cu film 78, the seed Cu film 76, the tantalum film 50 and the silicon oxide film 44 formed in the region except the second interconnection groove 46 and the via hole 48 are removed by CMP. Thus, the second Cu interconnection layer 52 of the Cu film 78 buried in the via hole 48, and the via portion of the Cu interconnection layer 52 of the Cu film 78 buried in the via hole 48 are formed (FIG. 13A).

Figure 13B:
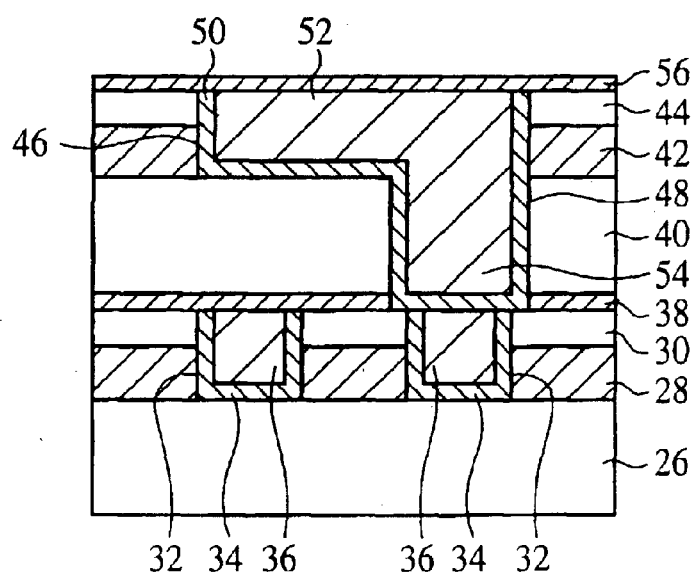
Figure 14A:
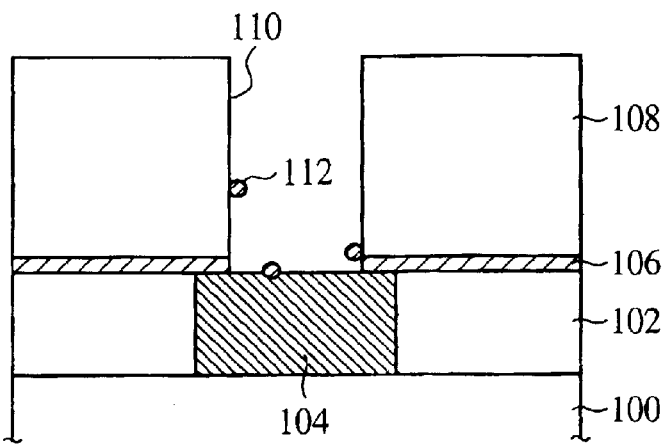
FIGS. 14A–14C are sectional views showing the formation of a contact hole by the conventional method.
Figure 14B:
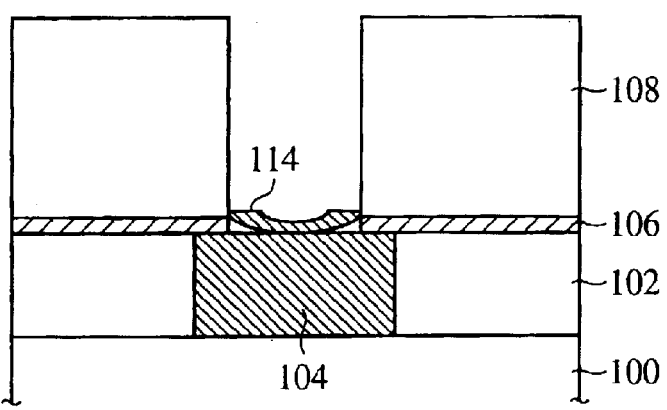
Figure 14C:
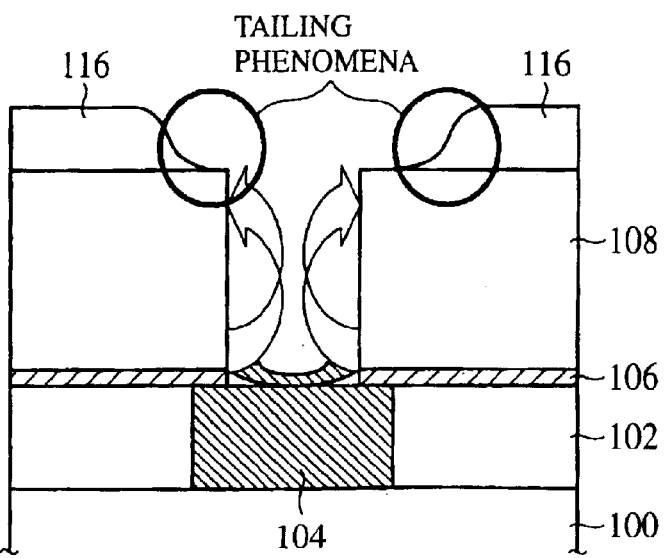
Figure 15:
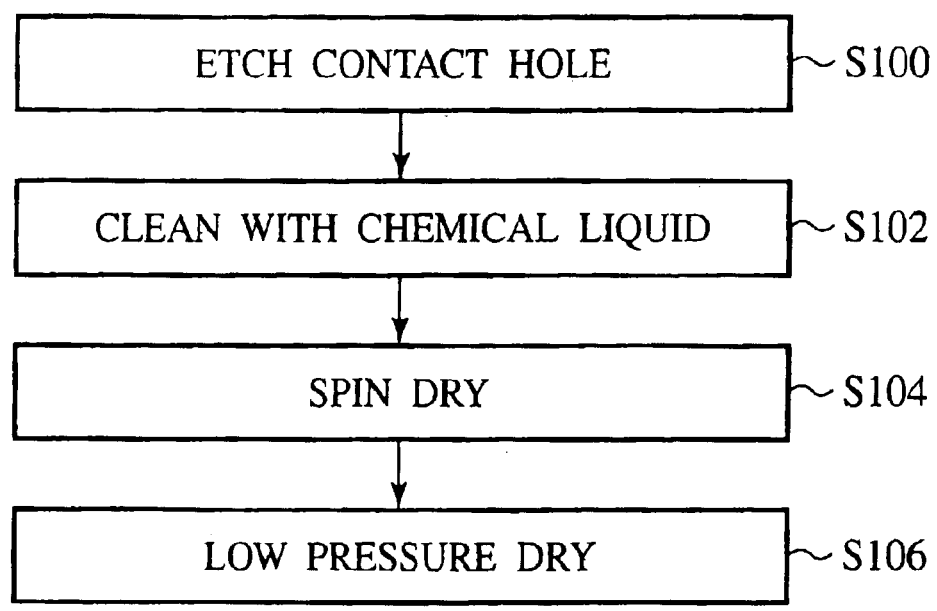
FIG. 15 is a flow chart of the conventional method for forming the contact hole.
Figure 16:
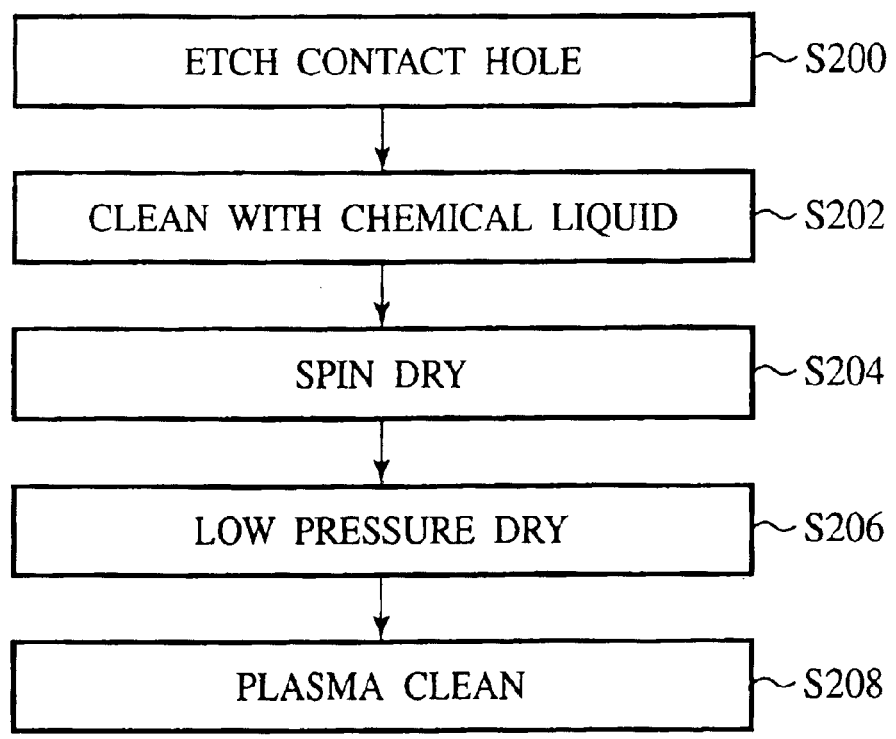
FIG. 16 is a flow chart of the conventional method for forming the contact hole.
Figure 17:
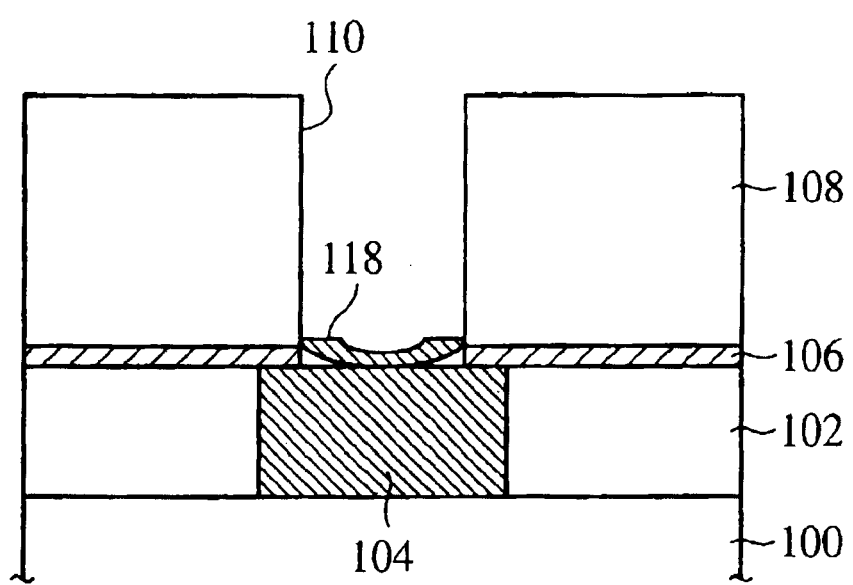
FIG. 17 is a sectional view of a deteriorated Cu surface layer formed on the surface of a Cu interconnection layer exposed on the bottom of the contact hole by its reaction with an alkaline chemical liquid.
Figure 18:
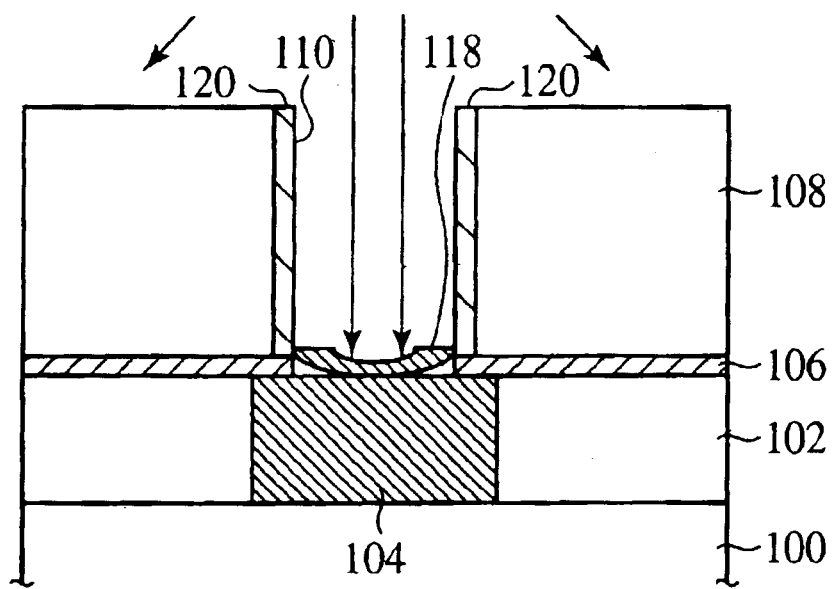
FIG. 18 is a sectional view of a degasified component adsorptive deteriorated film formed on the surface of the low dielectric constant insulation film by the plasma cleaning.

Then, the diffusion preventing film 56 of a 70 nm-thickness silicon nitride film is formed on the entire surface by, e.g., plasma CVD (FIG. 13B).

Thus, the multi-interconnection layer structure shown in FIG. 4 is fabricated by the method for fabricating a semiconductor device according to the present embodiment.

As described above, according to the present embodiment, the contact hole is cleaned with a chemical liquid and then annealed in a reducing atmosphere, whereby the contact hole can be sufficiently dried after cleaned, and fluorides and oxides of the Cu, such as $CuF_4$, $CuO$, $Cu_2O$, etc. formed on the surface of the Cu interconnection layers produced by the reaction with a chemical liquid can be removed. At this time, configurational defect and deteriorated surface of the insulation films with the contact holes formed in are not caused. Accordingly, the occurrence of contact resistance increases and contact defects between interconnection layers can be suppressed, and the Cu interconnection layers of high stability and reliability can be formed.

(Evaluation Result)

TABLE 2 shows results of the comparison of the Cu interconnection layer formed by the method for fabricating a semiconductor device according to the present embodiment with the Cu interconnection layers formed by the prior art in contact resistance, interconnection capacitance and interconnection durability.

TABLE 2

| Cleaning Method | Contact Resistance | Interconnection Capacitance | Interconnection Durability |
| --- | --- | --- | --- |
| Prior Art 1 No low pressure drying, followed by no processing. | 1 | 1 | 1 |
| Prior Art 2 Low pressure drying alone. | 0.95 | 1 | 1.2 |
| Prior Art 3 Low pressure drying, followed by plasma processing. | 0.75 | 1.2 | 0.7 |
| Present Invention Low pressure drying, followed by reducing atmosphere annealing. | 0.8 | 1 | 2 |

In TABLE 2, the contact resistances were compared on a 0.15 μm-via diameter interconnection layer. The interconnection capacitances were compared on a line-and-space formed of 0.18 μm-width interconnection layers spaced by a 0.18 μm-gap. In the prior art 1, the chemical liquid cleaning was followed by drying by spin drying, and no processing followed to form the interconnection layers. In the prior art 2, the chemical liquid cleaning was followed by spin drying, and then the interconnection layers were formed. In the prior art 3, the spin drying and the low pressure drying, and further plasma processing followed the chemical liquid cleaning, and the interconnection layers were formed. The values shown in TABLE 1 are values relative to a contact resistance, an interconnection capacitance and an interconnection durability of the prior art 1 which were set to be 1.

As seen in TABLE 2, the prior art 3 and the present invention have especially the contact resistance decreased in comparison with the prior art 1.

However, the prior art 3 has the interconnection capacitance increased and the interconnection durability decreased in comparison with the prior art 1.

On the other hand, the present invention has no increase of the interconnection capacitance and has the interconnection durability doubled in comparison with the prior art 1.

As described above, the result shown in TABLE 2 has made it evident that the method for fabricating a semiconductor device according to the present invention can decrease the contact resistance without decreasing the interconnection durability.

[Modifications]

The present invention is not limited to the above-described embodiment and can cover other various modifications.

For example, in the above-described embodiment, the drying by spin drying and the low pressure drying are performed before the annealing in reducing atmospheres, but both drying methods may not be essentially performed. For example, before the annealing in a reducing atmosphere, the low pressure drying alone may be performed without the drying by spin drying.

In the above-described embodiment, the Cu interconnection layers are formed up to the second one, but the same processing is repeated to form more Cu interconnection layers in addition to the second one, whereby a multi-interconnection layer structure can be formed.

In the above-described embodiment, the annealing is performed in a reducing atmosphere of $NH_3$ gas, but the annealing may be performed in a reducing atmosphere of $H_2$ gas. The annealing may be performed in an atmosphere of a mixed gas of these gases with an inert gas such as $N_2$ gas, a rare gas or others.

The present invention is applicable not only to the above-described process of forming the interconnection layers, but also to processes of forming interconnection layers by the ordinary damascening.

What is claimed is:

1. A method for fabricating a semiconductor device comprising the steps of:

forming a second insulation film on a first insulation film formed above a substrate and having a copper interconnection layer buried in;

forming a contact hole in the second insulation film down to the copper interconnection layer;

cleaning the substrate with the contact hole formed with a chemical liquid;

drying the substrate cleaned with the chemical liquid; and annealing the dried substrate in a reducing atmosphere.

2. A method for fabricating a semiconductor device according to claim 1, wherein in the step of drying the substrate, the substrate is dried by establishing a lower pressure around the substrate.

3. A method for fabricating a semiconductor device according to claim 2, wherein in the step of drying the substrate, the substrate is dried by spin drying, and then a lower pressure is established around the substrate.

4. A method for fabricating a semiconductor device according to claim 1, wherein the reducing atmosphere is an atmosphere containing hydrogen and/or ammonium.

5. A method for fabricating a semiconductor device according to claim 2, wherein the reducing atmosphere is an atmosphere containing hydrogen and/or ammonium.

6. A method for fabricating a semiconductor device according to claim 3, wherein the reducing atmosphere is an atmosphere containing hydrogen and/or ammonium.

7. A method for fabricating a semiconductor device according to claim 1, wherein an oxygen concentration of the reducing atmosphere is equal to or less than 100 ppm.

8. A method for fabricating a semiconductor device according to claim 2, wherein an oxygen concentration of the reducing atmosphere is equal to or less than 100 ppm.

9. A method for fabricating a semiconductor device according to claim 3, wherein an oxygen concentration of the reducing atmosphere is equal to or less than 100 ppm.

10. A method for fabricating a semiconductor device according to claim 4, wherein an oxygen concentration of the reducing atmosphere is equal to or less than 100 ppm.

11. A method for fabricating a semiconductor device according to claim 1, wherein in the step of annealing the substrate in a reducing atmosphere, the substrate is annealed at a temperature equal to or more than 320° C. and equal to or less than 420° C.

12. A method for fabricating a semiconductor device according to claim 2, wherein in the step of annealing the substrate in a reducing atmosphere, the substrate is annealed at a temperature equal to or more than 320° C. and equal to or less than 420° C.

13. A method for fabricating a semiconductor device according to claim 3, wherein in the step of annealing the substrate in a reducing atmosphere, the substrate is annealed at a temperature equal to or more than 320° C. and equal to or less than 420° C.

14. A method for fabricating a semiconductor device according to claim 4, wherein in the step of annealing the substrate in a reducing atmosphere, the substrate is annealed at a temperature equal to or more than 320° C. and equal to or less than 420° C.

15. A method for fabricating a semiconductor device according to claim 1, wherein the first insulation film and/or the second insulation film is an organic film or an organosilicate film.

16. A method for fabricating a semiconductor device according to claim 2, wherein the first insulation film and/or the second insulation film is an organic film or an organosilicate film.

17. A method for fabricating a semiconductor device according to claim 3, wherein the first insulation film and/or the second insulation film is an organic film or an organosilicate film.

18. A method for fabricating a semiconductor device according to claim 1, further comprising the step of:

burying a metal film in the contact hole.

19. A method for fabricating a semiconductor device according to claim 2, further comprising the step of:

burying a metal film in the contact hole.

20. A method for fabricating a semiconductor device according to claim 3, further comprising the step of:

burying a metal film in the contact hole.

* * * * *